US007782119B2

(12) United States Patent
Kameyama et al.

(10) Patent No.: US 7,782,119 B2
(45) Date of Patent: Aug. 24, 2010

(54) SEMICONDUCTOR INTEGRATED CIRCUIT AND OPERATION METHOD FOR THE SAME

(75) Inventors: Tadashi Kameyama, Tokyo (JP); Takayasu Ito, Tokyo (JP); Seiichi Saito, Tokyo (JP); Koji Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/422,854

(22) Filed: Apr. 13, 2009

(65) Prior Publication Data

US 2009/0295458 A1 Dec. 3, 2009

(30) Foreign Application Priority Data

May 27, 2008 (JP) ............................ 2008-137778

(51) Int. Cl.
*H01L 35/00* (2006.01)

(52) U.S. Cl. ........................ 327/513; 327/539; 327/540

(58) Field of Classification Search ................. 327/512, 327/513, 534, 535, 537, 539, 540, 541
See application file for complete search history.

(56) References Cited

U.S. PATENT DOCUMENTS 6,803,803 B1 * 10/2004 Starr et al. .................. 327/378
6,982,915 B2 * 1/2006 Houston et al. ............. 365/211
7,205,755 B2 4/2007 Ito et al.

FOREIGN PATENT DOCUMENTS

JP 2006-286678 A 10/2006

OTHER PUBLICATIONS

MXA1617 data sheet "Remote/Local Temperature Sensor with SMBus Serial Interface" pp. 1-20, 19-1265; Rev 1; Mar. 1998.
LM89 data sheet "LM89±0.75° C. Accurate, Remote Diode and Local Digital Temperature Sensor with Two-Wire Interface" Dec. 2004, National Semiconductor Corporation.

* cited by examiner

*Primary Examiner*—Jeffrey S Zweizig
(74) *Attorney, Agent, or Firm*—Miles & Stockbridge P.C.

(57) ABSTRACT

The semiconductor integrated circuit is provided, in which an external temperature control or temperature monitoring is possible, with little influence by the noise of a system board which mounts the semiconductor integrated circuit. The semiconductor integrated circuit includes the temperature detection circuit which detects the chip temperature, and the functional module which flows a large operating current. An external terminal which supplies operating voltage, and an external terminal which supplies ground voltage are coupled to the functional module. The temperature detection circuit generates a temperature detection signal and a reference signal. The reference signal and the temperature detection signal are led out to the exterior of the semiconductor integrated circuit via a first external output terminal and a second external output terminal, respectively, and are supplied to an external temperature control/monitoring circuit which has a circuitry type of a differential amplifier circuit.

18 Claims, 4 Drawing Sheets

SEMICONDUCTOR INTEGRATED CIRCUIT AND OPERATION METHOD FOR THE SAME

CROSS-REFERENCE TO RELATED APPLICATIONS

The disclosure of Japanese Patent Application No. 2008-137778 filed on May 27, 2008 including the specification, drawings and abstract is incorporated herein by reference in its entirety.

BACKGROUND OF THE INVENTION

The present invention relates to a semiconductor integrated circuit and an operation method for the same, in particular, to technology which is useful for performing temperature control or temperature monitoring outside a semiconductor integrated circuit which has a built-in functional module with a large operating current and a built-in temperature detection circuit to detect chip temperature and which is influenced greatly by the noise of a system board.

Document 1 in the following describes the outline of a semiconductor integrated circuit working as a precision digital thermometer (product name MAX1617) which reports the temperature of both a remote sensor and its own package. A diode-connected transistor as a remote sensor and a 2200 pF noise filtering capacitor are coupled in parallel to two external input terminals of the semiconductor integrated circuit. One external input terminal of two external input terminals functions as a current source of the remote sensor and a non-inverted input terminal of an A/D converter. The other external input terminal of two external input terminals functions as a current sink of the remote sensor and an inverted input terminal of the A/D converter.

Inside the semiconductor integrated circuit of the product name MAX1617, a first variable current source is coupled between power supply voltage Vcc and the one external input terminal, and a first diode is coupled between the other external input terminal and ground voltage. Also inside the present semiconductor integrated circuit, a second variable current source, a second diode, and a third diode are coupled in series between the power supply voltage Vcc and the ground voltage. Therefore, a first current flows from the power supply voltage Vcc toward the ground voltage through the first variable current source, the remote sensor, and the first diode; and a second current flows from the power supply voltage Vcc toward the ground voltage through the second variable current source, the second diode, and the third diode. Remote voltage between both ends of the remote sensor and local voltage between both ends of the second diode are supplied to an input of the A/D converter through a multiplexer. An output of the A/D converter is coupled to an input of a remote temperature data register and an input of a local temperature data register.

The remote temperature data register, a high remote temperature threshold data register, and a low remote temperature threshold data register are coupled to a remote digital comparator. The local temperature data register, a high local temperature threshold data register, and a low local temperature threshold data register are coupled to a local digital comparator. An output of the remote digital comparator and an output of the local digital comparator are supplied to a set input terminal of a flip-flop through an OR gate. An output signal of the flip-flop is supplied to a gate of an output MOS transistor. An open drain of the output MOS transistor functions as an alert output which enables interruption to a micro controller.

Document 2 in the following describes an outline of a semiconductor integrated circuit of a product name LM89 which is analogous to the semiconductor integrated circuit of the product name MAX1617 described in Document 1. A diode-connected transistor as a remote diode and a capacity of 2.2 nF are coupled in parallel to two external input terminals of the analogous semiconductor integrated circuit. The present semiconductor integrated circuit accurately measures its own temperature as well as the temperature of an external device. Inside the semiconductor integrated circuit, two external input terminals to which the remote diode is coupled are coupled to an input of a signed 10-bit Δ-S A/D converter through a local/remote diode selector and a temperature sensor circuit.

An output of the signed 10-bit Δ-S A/D converter is supplied to one input terminal of a first comparator, one input terminal of a second comparator, and one input terminal of a third comparator, through a filter. A high temperature limit register is coupled to the other input terminal of the first comparator, a low temperature limit register is coupled to the other input terminal of the second comparator, and a temperature critical-limit and hysteresis register is coupled to the other input terminal of the third comparator. Outputs of the first comparator, the second comparator, and the third comparator are supplied to a set input terminal of a flip-flop, and an output of the flip-flop is supplied to a gate of a first output MOS transistor. An open drain of the first output MOS transistor functions as an alert output. The alert output is activated when temperature goes outside a programmed window set up by the high temperature limit register and the low temperature limit register or exceeds the programmed critical limit. The output of the third comparator is also supplied to a gate of a second output MOS transistor, and an open drain of the second output MOS transistor functions as a temperature critical alert output. When the temperature exceeds the programmed critical limit, the temperature critical alert output is activated. A shutdown control input terminal of a main power supply responds to the activated temperature critical alert output, and the main CPU voltage, supplied from the main power supply to a processor which has the built-in remote thermal diode, is shut down.

On the other hand, Document 3 in the following describes a temperature detection circuit which is preferred for a CMOS process, and which generates band gap reference voltage $V_{bgr}$ of low temperature dependence and a temperature detection signal $V_{tsense}$ of which the temperature gradient can be set arbitrarily. The present temperature detection circuit is composed of a band gap generating part and an amplification/feedback part. The band gap generating part includes a first and a second transistor, and a first through a fourth resistor. The amplification/feedback part includes a CMOS differential amplifier circuit. In the band gap generating part, collectors of the first and the second transistor are coupled to power supply voltage through the first and the second resistor, respectively. An emitter of the first transistor is coupled to one end of a third resistor and the fourth resistor coupled in common. The other end of the third resistor is coupled to an emitter of the second transistor, and the other end of the fourth resistor is coupled to the ground voltage.

Emitter current density of the second transistor is set smaller than emitter current density of the first transistor. Collector voltage of the first transistor detected by the first resistor, and collector voltage of the second transistor detected by the second resistor are respectively supplied to difference input terminals of the CMOS differential amplifier circuit. An output signal of the CMOS differential amplifier circuit is fed back to a base of the first transistor and a base of the second transistor. Band gap reference voltage $V_{bgr}$ is given by the sum of base-emitter voltage $V_{be}$ of the first transistor and the voltage drop of the fourth resistor, where the voltage drop of the fourth resistor is determined by the sum of the emitter current of the first transistor and the emitter current of the second transistor. A temperature detection signal $V_{tsense}$ is set up by a voltage drop of the fourth resistor which is determined by the sum of the emitter current of the first transistor and the emitter current of the second transistor.

In a chip of a system LSI, the temperature detection circuit described above, CPU, RAM, a clock generation circuit, an input/output interface, and an analog buffer circuit are integrated. The temperature detection signal $V_{tsense}$ generated in the temperature detection circuit is transferred to an A/D converter provided outside the chip through the analog buffer circuit, and the converted digital information from the A/D converter is supplied to CPU through the input/output interface. By referring to the converted digital information and a table which is determined in advance and indicates the preferred relationship between temperature and a clock frequency, CPU generates a clock control signal to supply to a clock generation circuit. For example, when temperature becomes higher than a constant value, the frequency of an operation clock is decreased, and the electric current consumption is reduced; accordingly, the temperature is lowered. On the contrary, when the temperature becomes lower than a constant value, the frequency of the operation clock is increased, and the electric current consumption is increased to gain the operating speed.

(Document 1) Product name MAX1617, data sheet: "Remote/Local Temperature Sensor with SMBus Serial Interface", pp. 1-20, http://datasheets.maxim-ic.com/en/ds/MAX1617.pdf. (Searched on Mar. 31, 2008)

(Document 2) Product name LM89, data sheet: "±0.75° C. Accurate, Remote Diode and Local Digital Temperature Sensor with Two-Wire Interface", pp. 1-20, http://cache.national.com/ds/LM/LM89.pdf. (Searched on Mar. 30, 2008)

(Document 3) Japanese Patent Application Laid-open No. 2006-286678.

SUMMARY OF THE INVENTION

Prior to the present invention, the present inventors were engaged in development of a temperature sensor built in a chip of a car navigation use microcomputer which was mounted in a vehicle. Progress of the miniaturization of a system LSI in recent years including a microcomputer is remarkable, and a 65 nm manufacturing process is developed currently. Keeping pace with the miniaturization of a semiconductor integrated circuit, a recent MOS transistor tends to exhibit low threshold voltage and increased standby leakage current.

On the other hand, the junction temperature of a chip of a system LSI rises by the increase in the operating ratio of the system LSI as indicated in an operation clock frequency and operating power voltage of a built-in CPU. However, the standby leakage current of an MOS transistor of the system LSI increases in exponential proportion to the temperature rise. By the increase in the standby leakage current, the chip temperature of the system LSI increases further.

The following fact has been clarified as a result of research on the standby leakage current in such a minitualized semiconductor integrated circuit. When the chip temperature of a system LSI rises to the critical temperature in the vicinity of 398K (125° C.), a vicious iteration between the increase in the standby leakage current and the rise of the chip temperature of LSI repeats endlessly, starts a thermal runaway, and finally leads to a thermal destruction of the chip of the system LSI. When a thermal runaway starts, even if the operation clock frequency of a built-in CPU is decreased, the chip temperature of the system LSI cannot be reduced, and it becomes very difficult to break the vicious iteration between the increase in the leakage current and the rise of the chip temperature.

Therefore, the architecture has been developed, in which a temperature sensor is built in a chip of a system LSI to monitor the chip temperature and the operating ratio of the system LSI is reduced when the rise of the chip temperature is detected. The reduction in the operating ratio of the system LSI is realizable by decreasing the operation clock frequency of the built-in CPU gradually. A thermal runaway protection system is employed, in which the power supply voltage of the built-in CPU is shut down when the temperature sensor detects the chip temperature rise to near the critical temperature of the thermal runaway.

As such a temperature sensor to be built in a chip of a system LSI, it is possible to employ the technology of the remote temperature sensor and the remote diode which are described in Document 1 and Document 2, and the technology of the temperature detection circuit which is described in Document 3.

The present inventors started development of a temperature sensor to be built in a chip of an on-vehicle microcomputer for car navigation use through the development described above.

However, it became clear at the beginning of the development that the accuracy of a temperature sensor was insufficient. The temperature sensor itself had comparatively high accuracy of as precise as ±1° C. However, when a system LSI which had the built-in temperature sensor was mounted in a car navigation system board, it turned out that the temperature detection precision fell greatly to ±12° C. Due to the fall of the temperature detection precision, in the design of a system, it is necessary to set the temperature at which the power supply voltage of a built-in CPU is shut down, to temperature lower than the guarantee temperature by 12° C. Therefore, the operating ratio of the system LSI was suppressed more than needed, and the performance of the system LSI turned out to degrade.

When the present inventors analyzed the cause of the fall of the temperature detection precision in the system board on which the system LSI with the built-in temperature sensor was mounted, it was proven that the cause was the noise in the system board.

First, in a system board, power supply noise and ground noise are generated by a functional module with a large operating current, such as CPU and an output data buffer which are built in the system LSI. The power supply noise and the ground noise generated by the functional module with a large operating current get mixed in with a temperature detection signal of the temperature sensor built in the system LSI. In the system board, EMI noise from the other electronic equipment gets also mixed in with the temperature detection signal of the temperature sensor built in the system LSI. Particularly, a large noise from an engine igniter of a vehicle enters in a temperature sensor built in the chip of an on-vehicle microcomputer for the car navigation use.

As described in Document 1, a noise filtering capacitor of comparatively large capacitance is coupled in parallel to a diode-connected transistor as a remote sensor. However, it is difficult to fully attenuate the large noise.

The present invention is accomplished as a result of the above-described examination conducted by the present inventors prior to the present invention.

Therefore, the present invention has been made in view of the above circumstances and provides a semiconductor integrated circuit which has a built-in functional module of a large operating current and a built-in temperature detection circuit detecting chip temperature, and which can perform temperature control or temperature monitoring outside the semiconductor integrated circuit under little influence of noise by a system board.

The present invention also provides a semiconductor integrated circuit which can perform precise and safe control of the chip temperature under little influence of noise by a system board.

The other purposes and the new feature of the present invention will become clear from the description of the present specification and the accompanying drawings.

The following is a brief explanation of typical one of the inventions disclosed in the present application.

That is, a typical semiconductor integrated circuit (1) according to an embodiment of the present invention includes a temperature detection circuit (10) which detects chip temperature, and a functional module (11) which flows a large operating current.

An external operating voltage supply terminal (T5) which supplies operating voltage (Vcc), and an external ground voltage supply terminal (T2) which supplies ground voltage (GND) are coupled to the functional module (11). The temperature detection circuit (10) generates a temperature detection signal (a temperature detection voltage signal, $V_{TSEN}$) with predetermined temperature dependence, and a reference signal (a reference voltage signal, $V_{REF}$) with temperature dependence smaller than the predetermined temperature dependence. The reference signal ($V_{REF}$) and the temperature detection signal ($V_{TSEN}$) are led to the exterior of the semiconductor integrated circuit via a first external output terminal (T3) and a second external output terminal (T4), respectively, and supplied to an external temperature control/monitoring circuit (2) which has a circuitry type of a differential amplifier circuit (CP100) (refer to FIG. 1).

The following explains briefly the effect acquired by the typical one of the inventions disclosed by the present application.

That is, the present invention provides a semiconductor integrated circuit which has a built-in functional module of a large operating current and a built-in temperature detection circuit detecting chip temperature, and which can perform temperature control or temperature monitoring in the exterior of the semiconductor integrated circuit where the influence of noise by a system board is large.

DETAILED DESCRIPTION OF THE PREFERRED EMBODIMENTS

Typical Embodiment

Figure 1:
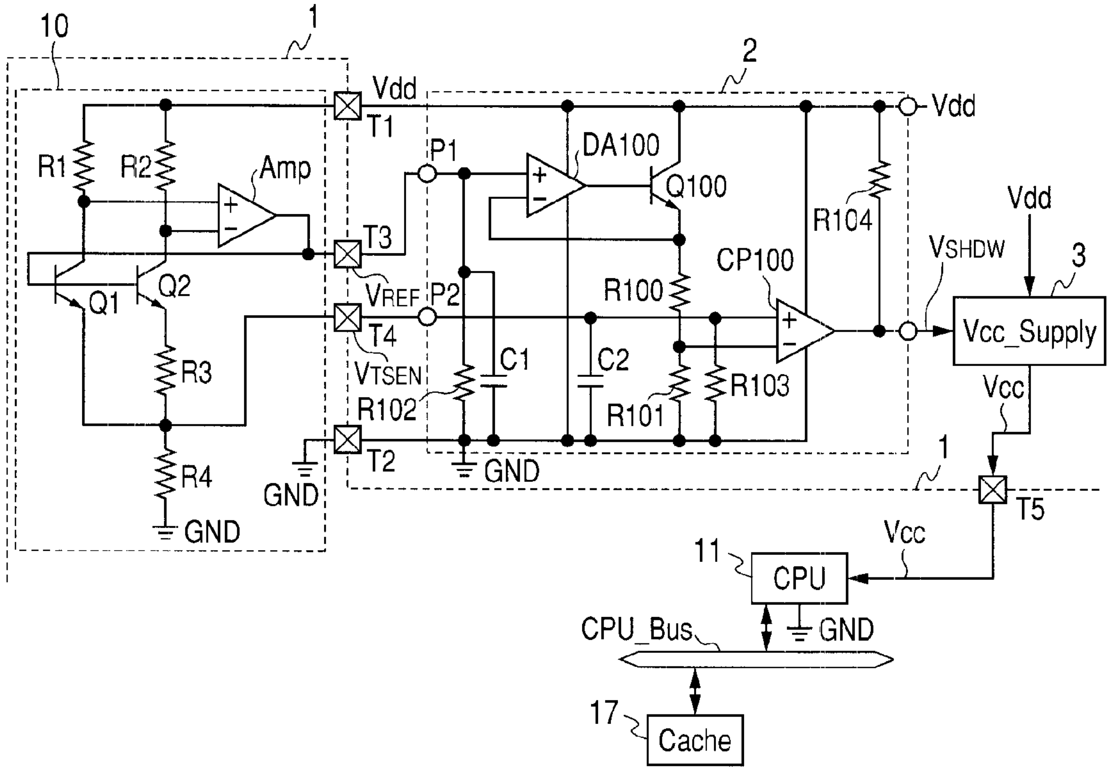
FIG. 1 is a drawing illustrating configuration of a system board in which a semiconductor integrated circuit, an over-temperature control circuit, and a power supply circuit are mounted as a system LSI, according to an embodiment of the present invention.

First, an outline is explained on a typical embodiment of the invention disclosed in the present application. A numerical symbol in parentheses referring to a component of the drawing in the outline explanation about the typical embodiment only illustrates what is included in the concept of the component to which the numerical symbol is attached.

<1> A semiconductor integrated circuit (1) according to a typical embodiment of the present invention includes a temperature detection circuit (10) which detects chip temperature, and a functional module (11) which flows operating current greater than the operating current of the temperature detection circuit.

An external operating voltage supply terminal (T5) which supplies operating voltage (Vcc) and an external ground voltage supply terminal (T2) which supplies ground voltage (GND), both from the exterior of the semiconductor integrated circuit, are coupled to the functional module (11).

The temperature detection circuit (10) generates a temperature detection signal ($V_{TSEN}$) with predetermined temperature dependence, and a reference signal ($V_{REF}$) with temperature dependence smaller than the predetermined temperature dependence.

The reference signal and the temperature detection signal are led to the exterior of the semiconductor integrated circuit via a first external output terminal (T3) and a second external output terminal (T4), respectively, so as to enable the control/monitoring by an external temperature control/monitoring circuit in the exterior of the semiconductor integrated circuit. The external temperature control/monitoring circuit has a circuitry type of a differential amplifier circuit (CP100).

The reference signal ($V_{REF}$) and the temperature detection signal ($V_{TSEN}$) led to the exterior of the semiconductor integrated circuit are supplied to the external temperature control/monitoring circuit (refer to FIG. 1).

According to the embodiment, the external temperature control/monitoring circuit (2) which has a circuitry type of the differential amplifier circuit (CP100) has the common mode rejection function in the exterior of the semiconductor integrated circuit. On the other hand, due to the large operating current of the functional module, power supply noise and ground noise are generated in the system board, and the noise gets mixed in with the reference signal ($V_{REF}$) and the temperature detection signal ($V_{TSEN}$) which are generated from the temperature detection circuit (10). However, the noise mixed in the temperature detection signal ($V_{TSEN}$) and the noise mixed in the reference signal ($V_{REF}$) can be canceled by the common mode rejection function of the differential amplifier circuit of the exterior of the semiconductor integrated circuit. As a result, it is possible to provide the semiconductor integrated circuit which enables the temperature control or temperature monitoring in the exterior of the semiconductor integrated circuit with little influence by noise generated in the system board. The system board has the built-in functional module with a large operating current and the built-in temperature detection circuit to detect the chip temperature.

Figure 6:
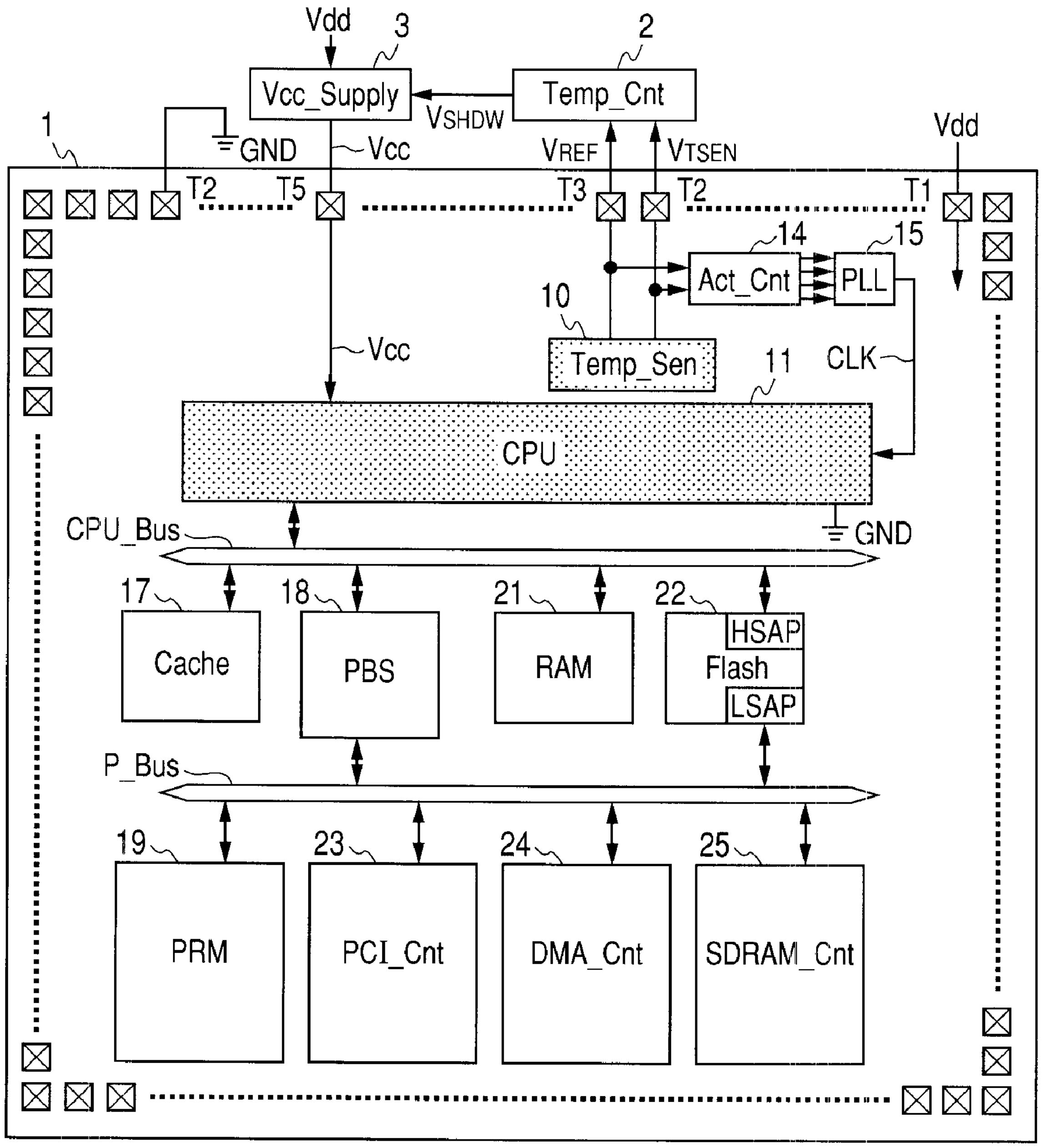
FIG. 6 is a drawing illustrating configuration of a system board for which high reliability is required as in a car navigation use, and in which a semiconductor integrated circuit, an over-temperature control circuit, and a power supply circuit are mounted as a system LSI, according to the most specific embodiment of the present invention.

According to a preferred embodiment, in a chip of the semiconductor integrated circuit, the temperature detection circuit (10) is arranged in close proximity to the functional module (11), without another functional device and another functional block interposed between the temperature detection circuit (10) and the functional module (11) (refer to FIG. 6).

According to a more preferred embodiment, the reference signal ($V_{REF}$) and the temperature detection signal ($V_{TSEN}$) generated by the temperature detection circuit (10) are supplied to an operating ratio control circuit (14) which has a circuitry type of plural differential amplifier circuits (CP1-CP4).

The plural differential amplifier circuits (CP1-CP4) of the operating ratio control circuit (14) perform multilevel discrimination of the relationship between the reference signal ($V_{REF}$) and the temperature detection signal ($V_{TSEN}$) generated by the temperature detection circuit (10), and generate a multilevel discrimination result.

When the chip temperature rises, the operating ratio control circuit (14) uses the multilevel discrimination result to decrease the operating ratio of the functional module (11) step-by-step.

According to a yet more preferred embodiment, the reference signal ($V_{REF}$) and the temperature detection signal ($V_{TSEN}$) generated by the temperature detection circuit (10) are also supplied to an over-temperature control circuit (2) which has a circuitry type of a first differential amplifier circuit (CP100).

Figure 3:
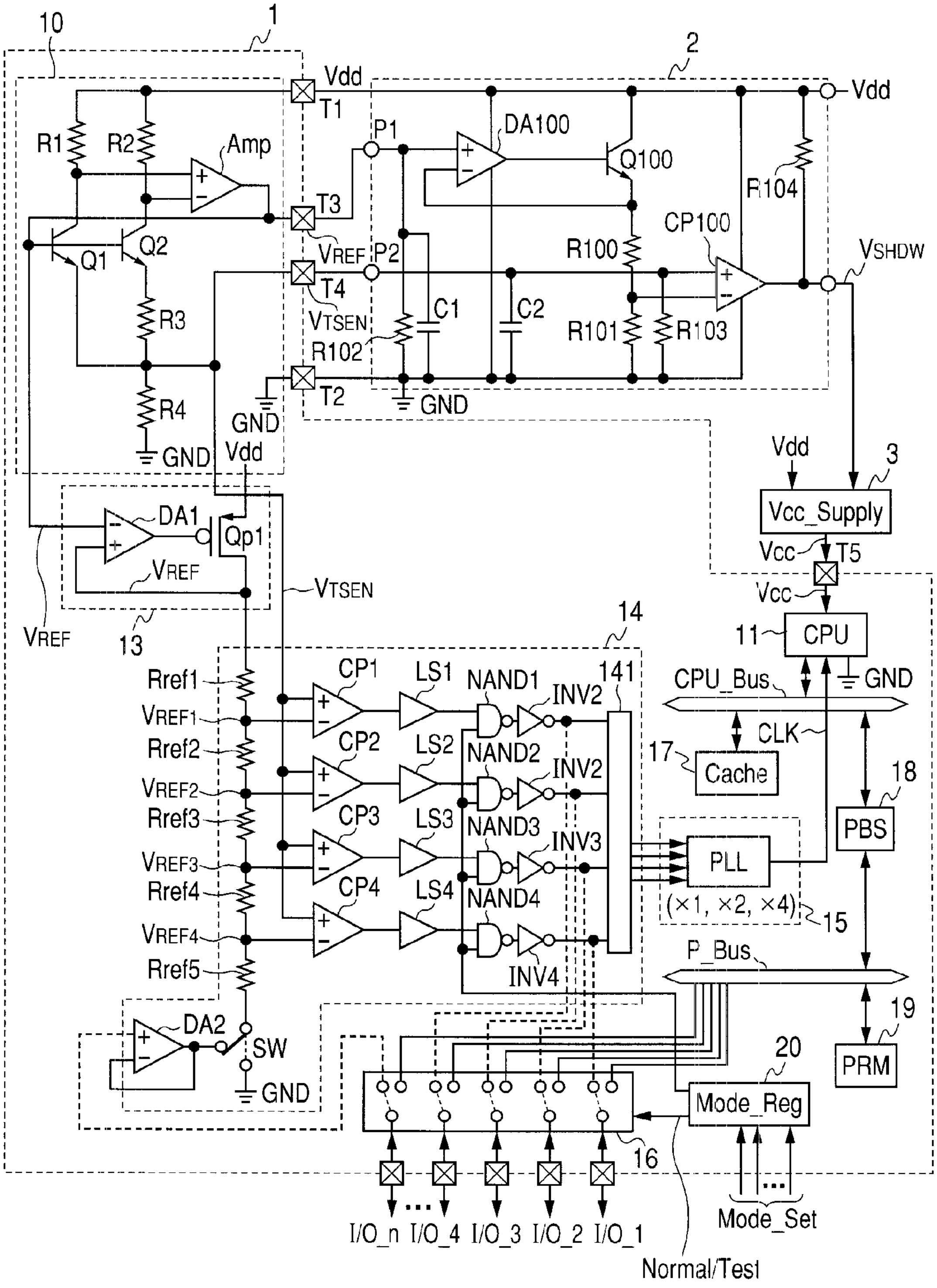
FIG. 3 is a drawing illustrating configuration of a system board for which high reliability is required as in a car navigation use, and in which a semiconductor integrated circuit, an over-temperature control circuit, and a power supply circuit are mounted as a system LSI, according to a more specific embodiment of the present invention.

In an over-temperature state where the chip temperature exceeds a prescribed temperature, the first differential amplifier circuit (CP100) of the over-temperature control circuit (2) shuts off supply of power supply voltage (Vcc) to be supplied to the functional module (11), in response to the reference signal ($V_{REF}$) and the temperature detection signal ($V_{TSEN}$) which are generated by the temperature detection circuit (10) (refer to FIG. 3).

According to one specific embodiment, when the semiconductor integrated circuit is in the test mode, an external test signal is supplied from the exterior of the semiconductor integrated circuit to the plural differential amplifier circuits (CP1-CP4) of the operating ratio control circuit (14).

In the test mode, by supplying the external test signal from the exterior of the semiconductor integrated circuit, testing is enabled for the plural differential amplifier circuits (CP1-CP4), which generate the multilevel discrimination result, in the state where the chip temperature of the semiconductor integrated circuit is low (refer to FIG. 6).

According to another specific embodiment, plural test monitor terminals through which the test results of the plural differential amplifier circuits (CP1-CP4) are retrieved to external test equipment in the test mode, and an external signal supply terminal through which the external test signal is supplied are shared by plural signal terminals of the semiconductor integrated circuit in a normal operation mode.

Figure 4:
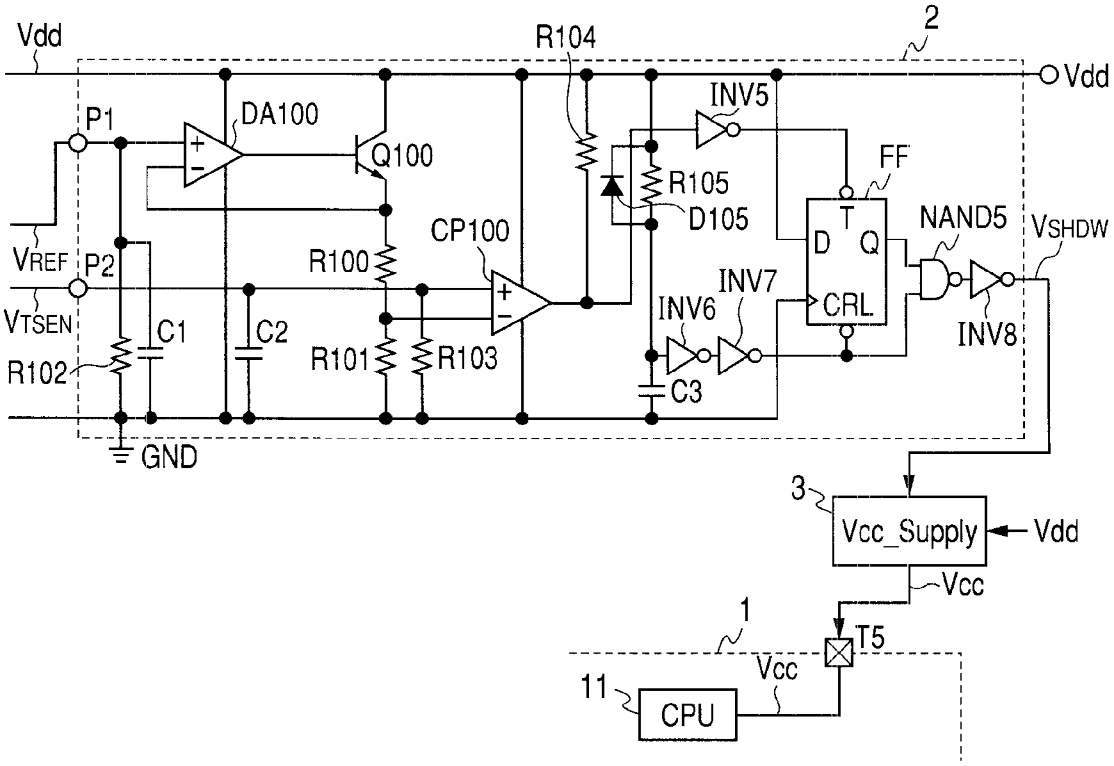
FIG. 4 is a drawing illustrating an improved over-temperature control circuit which is supplied with the temperature detection signal and the reference signal, generated in the temperature detection circuit of the semiconductor integrated circuit.

According to yet another specific embodiment, the functional module includes a central processing unit (11) (refer to FIG. 3, FIG. 4, and FIG. 6).

According to the most specific embodiment, the operating ratio control circuit (14) controls the operating ratio of the central processing unit (11) by changing a frequency of an operation clock (CLK) which is supplied to the central processing unit (11) of the functional module (refer to FIG. 6).

<2> A semiconductor integrated circuit (1) according to a typical embodiment of another viewpoint of the present invention includes a temperature detection circuit (10) which detects chip temperature of the semiconductor integrated circuit, and a functional module (11) flowing operating current greater than the operating current of the temperature detection circuit.

The functional module (11) is coupled to an external operating voltage supply terminal (T5) to which operating voltage (Vcc) is supplied from the exterior of the semiconductor integrated circuit, and to an external ground voltage supply terminal (T2) to which ground voltage (GND) is supplied from the exterior of the semiconductor integrated circuit.

The temperature detection circuit (10) generates a temperature detection signal ($V_{TSEN}$) having prescribed temperature dependence, and a reference signal ($V_{REF}$) having temperature dependence smaller than the prescribed temperature dependence.

The reference signal and the temperature detection signal generated from the temperature detection circuit (10) are supplied to an over-temperature control circuit (2) having a circuitry type of a first differential amplifier circuit (CP100), and also to an operating ratio control circuit (14) having a circuitry type of plural differential amplifier circuits (CP1-CP4).

The plural differential amplifier circuits (CP1-CP4) of the operating ratio control circuit (14) perform multilevel discrimination of relationship between the reference signal ($V_{REF}$) and the temperature detection signal ($V_{TSEN}$) which are generated by the temperature detection circuit (10), and generate a multilevel discrimination result.

When the chip temperature rises, the operating ratio control circuit (14) uses the multilevel discrimination result to decrease operating ratio of the functional module (11) step-by-step.

In an over-temperature state where the chip temperature exceeds a prescribed temperature, the first differential amplifier circuit (CP100) of the over-temperature control circuit (2) shuts off supply of the power supply voltage (Vcc) to be supplied to the functional module (11), in response to the reference signal ($V_{REF}$) and the temperature detection signal ($V_{TSEN}$) which are generated by the temperature detection circuit (10) (refer to FIG. 3).

According to the embodiment, each of the plural differential amplifier circuits (CP1-CP4) of the operating ratio control circuit (14) has the common mode rejection function. The first differential amplifier circuit (CP100) of the over-temperature control circuit (2) also has the common mode rejection function. On the other hand, due to the large operating current of the functional module, power supply noise and ground noise are generated in the system board, and these noises get mixed in with the reference signal ($V_{REF}$) and the temperature detection signal ($V_{TSEN}$) which are generated from the temperature detection circuit (10). However, the noise mixed in the temperature detection signal ($V_{TSEN}$) and the noise mixed in the reference signal ($V_{REF}$) can be canceled by the common mode rejection function had by each of the plural differential amplifier circuits (CP1-CP4) of the operating ratio control circuit (14), and can be canceled by the common mode rejection function of the first differential amplifier circuit (CP100) of the over-temperature control circuit (2).

When the chip temperature rises, the operating ratio control circuit (14) decreases the operating ratio of the functional module (11) step-by-step. In an over-temperature state where the chip temperature exceeds a prescribed temperature, the over-temperature control circuit (2) stops the supply of the power supply voltage (Vcc) to be supplied to the functional module (11). As a result, it is possible to provide the semiconductor integrated circuit which suffers little influence of the noise generated by the system board and which enables precise and safe control of the chip temperature.

According to a preferred embodiment, in a chip of the semiconductor integrated circuit, the temperature detection circuit (10) is arranged in close proximity to the functional module (11), without another functional device and another functional block interposed between the temperature detection circuit (10) and the functional module (11) (refer to FIG. 6).

According to a more preferred embodiment, when the semiconductor integrated circuit is in the test mode, an external test signal is supplied from the exterior of the semiconductor integrated circuit to the plural differential amplifier circuits (CP1-CP4) of the operating ratio control circuit (14).

In the test mode, by supplying the external test signal from the exterior of the semiconductor integrated circuit, testing is enabled for the plural differential amplifier circuits (CP1-CP4), which generate the multilevel discrimination result, in the state where the chip temperature of the semiconductor integrated circuit is low (refer to FIG. 6).

According to a yet more preferred embodiment, plural test monitor terminals through which the test results of the plural differential amplifier circuits (CP1-CP4) are retrieved to external test equipment in the test mode, and an external signal supply terminal through which the external test signal is supplied are shared by plural signal terminals of the semiconductor integrated circuit in a normal operation mode.

According to a specific embodiment, the functional module includes a central processing unit (11) (refer to FIG. 3, FIG. 4, and FIG. 6).

According to the most specific embodiment, the operating ratio control circuit (14) controls the operating ratio of the central processing unit (11) by changing a frequency of an operation clock (CLK) which is supplied to the central processing unit (11) of the functional module (refer to FIG. 6).

<3> An operation method of a semiconductor integrated circuit according to a typical embodiment of yet another viewpoint of the present invention is provided, wherein the semiconductor integrated circuit includes a temperature detection circuit (10) which detects chip temperature of the semiconductor integrated circuit, and a functional module (11) which flows operating current greater than the operating current of the temperature detection circuit.

An external operating voltage supply terminal (T5) which supplies operating voltage (Vcc) from the exterior of the semiconductor integrated circuit, and an external ground voltage supply terminal (T2) which supplies ground voltage (GND) are coupled to the functional module (11).

The temperature detection circuit (10) generates a temperature detection signal ($V_{TSEN}$) with predetermined temperature dependence, and a reference signal ($V_{REF}$) with temperature dependence smaller than the predetermined temperature dependence.

The reference signal and the temperature detection signal generated from the temperature detection circuit (10) are supplied to an over-temperature control circuit (2) having a circuitry type of a first differential amplifier circuit (CP100), and also to an operating ratio control circuit (14) having a circuitry type of plural differential amplifier circuits (CP1-CP4).

The plural differential amplifier circuits (CP1-CP4) of the operating ratio control circuit (14) perform multilevel discrimination of the relationship between the reference signal ($V_{REF}$) and the temperature detection signal ($V_{TSEN}$) which are generated by the temperature detection circuit (10), and generate a multilevel discrimination result.

The semiconductor integrated circuit is mounted in a system board.

When the chip temperature rises during the operation of the semiconductor integrated circuit on the mother board of the system, the operating ratio control circuit (14) uses the multilevel discrimination result to decrease the operating ratio of the functional module (11) step-by-step.

In an over-temperature state where the chip temperature during the operation of the semiconductor integrated circuit exceeds prescribed temperature, the first differential amplifier circuit (CP100) of the over-temperature control circuit (2) stops the supply of the power supply voltage (Vcc) to be supplied to the functional module (11), in response to the reference signal ($V_{REF}$) and the temperature detection signal ($V_{TSEN}$), which are generated from the temperature detection circuit (10) (refer to FIG. 3).

Explanation of Embodiment

Next, an embodiment is explained further in full detail. In the entire diagrams for explaining the best mode for the embodiment of the present invention, the same symbol is attached to a component which has the same function as in the previous drawing, and the repeated explanation thereof is omitted.

<<A System LSI and an Over-Temperature Control Circuit Mounted in a System Board>>

FIG. 1 illustrates configuration of a system board in which a semiconductor integrated circuit 1, an over-temperature control circuit 2, and a power supply circuit 3 are mounted as a system LSI, according to an embodiment of the present invention. That is, the system board illustrated in FIG. 1 is required for high reliability, as in a system board for use in an on-vehicle car-navigation system. The semiconductor integrated circuit 1 is a microcomputer for use in the car navigation system, and includes internal circuits such as a temperature detection circuit 10 which detects the temperature of a chip, a central processing unit (CPU) 11, and a cache memory 17. In the semiconductor integrated circuit 1, the central processing unit 11 has greater operating current than that of the temperature detection circuit 10. The central processing unit 11 is coupled to an external operating voltage supply terminal T5 through which operating voltage Vcc is supplied from the exterior of the semiconductor integrated circuit 1, and to an external ground voltage supply terminal T2 through which ground voltage GND is supplied from the exterior of the semiconductor integrated circuit 1.

The temperature detection circuit 10 detects the chip temperature of the semiconductor integrated circuit 1, and detects an over-temperature state that the chip temperature exceeds for example, 135° C. In the over-temperature state, the semiconductor integrated circuit 1 repeats endlessly a vicious iteration between the increase in the standby leakage current and the rise of the chip temperature of LSI, and starts a thermal runaway. The temperature detection circuit 10 generates a temperature detection signal $V_{TSEN}$ in response to the chip temperature of LSI, and also generates a reference signal $V_{REF}$ in order to reduce the influence of noise.

The temperature detection signal $V_{TSEN}$ and the reference signal $V_{REF}$ generated in the temperature detection circuit 10 of the semiconductor integrated circuit 1 are supplied to the difference input terminal of a voltage comparator of the over-temperature control circuit 2 mounted in the system board. The noise of the system board induces power supply noise and ground noise in the semiconductor integrated circuit 1. Although noise is mixed in the temperature detection signal $V_{TSEN}$ generated in the temperature detection circuit 10, noise of an almost identical level is mixed also in the reference signal $V_{REF}$ generated in the temperature detection circuit 10. The temperature detection signal $V_{TSEN}$ and the reference signal $V_{REF}$ are supplied to the difference input terminal of the voltage comparator of the over-temperature control circuit 2. Therefore, the noise mixed in the temperature detection signal $V_{TSEN}$ and the noise mixed in the reference signal $V_{REF}$ can be canceled by the common mode rejection function in the differential amplifier operation of the voltage comparator.

The temperature detection signal $V_{TSEN}$ has comparatively large temperature dependence given by the following equation.

$$\Delta V_{BE}/\Delta T=(V_{BE}-E_g-3(kT/q))/T\approx-1.8\text{ mV/° C.}$$

Here, $V_{BE}$ is base-emitter voltage of a transistor, $E_g$ is band gap voltage of silicon, k is a Boltzmann's constant, T is absolute temperature, and q is electronic charge. When the noise level of the temperature detection signal $V_{TSEN}$ is assumed to be within the realistic range of ±10-±50 mV, and if no noise cancellation is performed by the temperature detection signal $V_{TSEN}$, then the error of ±5.5° C.-±37.7° C. will occur due to only the noise of the temperature detection signal $V_{TSEN}$. Accordingly, it becomes possible to perform the accurate temperature detection by performing noise cancellation by the common mode rejection function in the differential amplifier operation of the voltage comparator of the over-temperature control circuit 2. Accordingly, it becomes possible to perform a high-precision temperature detection by performing noise cancellation by such a common mode rejection function.

<<Thermal-Shutdown-Protected Operation>>

In an over-temperature state, a temperature detection signal $V_{TSEN}$ corresponding to the over-temperature state is generated from the temperature detection circuit 10 of the semiconductor integrated circuit 1 on which the influence of noise is reduced as described above. In contrast to the fact that the temperature detection signal $V_{TSEN}$ has predetermined temperature dependence, the reference signal $V_{REF}$ has very small temperature dependence. In an over-temperature state, the voltage comparator of the over-temperature control circuit 2 generates a shutdown control output signal $V_{SHDW}$, responding to the level difference between the temperature detection signal $V_{TSEN}$ and the reference signal $V_{REF}$. Responding to the shutdown control output signal $V_{SHDW}$ from the over-temperature control circuit 2, the power supply circuit 3 of the semiconductor integrated circuit 1 stops the supply of internal operating power supply voltage Vcc to the central processing unit 11. Therefore, since the central processing unit 11 is forced to stop the operation, the chip temperature of the semiconductor integrated circuit 1 falls gradually. In the state where the temperature detection signal $V_{TSEN}$ from the temperature detection circuit 10 of the semiconductor integrated circuit 1 does not indicate an over-temperature state, the power supply circuit 3 supplies the internal operating power supply voltage Vcc to the internal circuit of the central processing unit 11 of the semiconductor integrated circuit 1.

<<The Temperature Detection Circuit of the Semiconductor Integrated Circuit>>

The temperature detection circuit 10 of the semiconductor integrated circuit 1 is composed of a band gap generating part and an amplification/feedback part. The band gap generating part includes a first NPN-type transistor Q1, a second NPN-type transistor Q2, a first resistor R1, a second resistor R2, a third resistor R3, and a fourth resistor R4. The amplification/feedback part includes a CMOS differential amplifier circuit Amp. In the band gap generating part, the collector of the first transistor Q1 and the collector of the second transistor Q2 are coupled to the power supply voltage Vdd via the first resistor R1 and the second resistor R2, respectively, and the emitter of the first transistor Q1 is coupled to a commonly coupled end of the third resistor R3 and the fourth resistor R4. The other end of the third resistor R3 is coupled to the emitter of the second transistor Q2, and the other end of the fourth resistor R4 is coupled to the ground voltage.

The emitter current density of the second transistor Q2 is set smaller than the emitter current density of the first transistor Q1. The collector voltage of the first transistor and the collector voltage of the second transistor, detected respectively by the first resistor R1 and the second resistor R2, are supplied to the difference input terminals of the CMOS differential amplifier circuit Amp, and the output signal of the CMOS differential amplifier circuit Amp is negatively fed back to the base of the first transistor Q1 and the base of the second transistor Q2. The band gap reference voltage $V_{REF}$ is given by the sum of the base-emitter voltage $Vbe_{Q1}$ of the first transistor Q1 and the voltage drop of the fourth resistor R4. The voltage drop of the fourth resistor R4 is given by the sum of the emitter current of the first transistor Q1 and the emitter current of the second transistor Q2. Therefore, the band gap reference voltage $V_{REF}$ is obtained by the following equation.

$$V_{REF}=Vbe_{Q1}+Ie*R4=Vbe_{Q1}+(Ie1+Ie2)\cdot R4 \qquad (1)$$

Since the element size of the second transistor Q2 is set m times as large as the element size of the first transistor Q1, the emitter current density of the first transistor Q1 is set up m times as large as the emitter current density of the second transistor Q2. The first resistor R1 and the second resistor R2 are set up equal in resistance. By the negative feedback from the output of the CMOS differential amplifier circuit Amp to the base of the first transistor Q1 and the base of the second transistor Q2, the emitter current Ie1 of the first transistor Q1 and the emitter current Ie2 of the second transistor Q2 are controlled to be equal in magnitude. The emitter current Ie2 of the second transistor Q2 is obtained as in the following equation, by using difference voltage ΔVbe between the base-emitter voltage $Vbe_{Q1}$ of the first transistor Q1 and the base-emitter voltage $Vbe_{Q2}$ of the second transistor Q2, due to the difference of the emitter current density.

$$Ie2=\Delta Vbe/R3=kT/q\cdot 1n(m)/R3 \qquad (2)$$

Substituting Equation (2) into Equation (1), the following equation is obtained.

$$\begin{aligned} V_{REF} &= Vbe_{Q1}+Ie\cdot R4 \qquad (3)\\ &= Vbe_{Q1}+(Ie1+Ie2)\cdot R4\\ &= Vbe_{Q1}+2kT/q\cdot R4/R3\cdot 1n(m) \end{aligned}$$

Here, k is a Boltzmann's constant, T is absolute temperature, and q is electronic charge.

By setting the resistance ratio of the third resistor R3 and the fourth resistor R4 so as to cancel out the negative temperature dependence of the first term by the positive temperature dependence of the second term in Equation (3), the band gap reference voltage $V_{REF}$ of very small temperature dependence can be generated.

The temperature detection signal $V_{TSEN}$ is given by the voltage drop of the fourth resistor which is determined by the sum of the emitter current of the first transistor Q1 and the emitter current of the second transistor Q2 (Ie1+Ie2), as in the following equation.

$$V_{TSEN}=(Ie1+Ie2)\cdot R4=2kT/q\cdot R4/R3\cdot 1n(m) \quad (4)$$

Equation (4) implies that the temperature detection signal $V_{TSEN}$ has positive temperature dependence which is given by the resistance ratio of the fourth resistor R4 to the third resistor R3.

Figure 2:
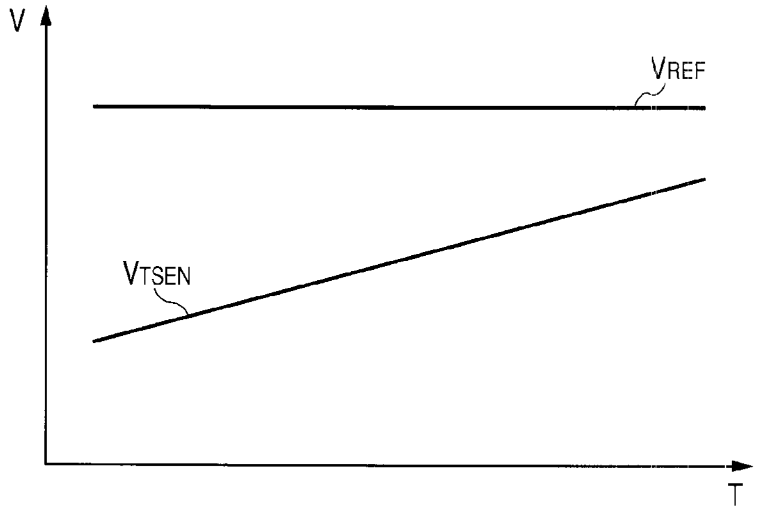
FIG. 2 is a drawing illustrating temperature dependence of band gap reference voltage and a temperature detection signal, generated by a temperature detection circuit of the semiconductor integrated circuit illustrated in FIG. 1.

FIG. 2 illustrates the temperature dependence of the band gap reference voltage $V_{REF}$ and the temperature detection signal $V_{TSEN}$, generated by the temperature detection circuit 10 of the semiconductor integrated circuit 1 illustrated in FIG. 1.

As illustrated in FIG. 2, while the band gap reference voltage $V_{REF}$ has very small temperature dependence, the temperature detection signal $V_{TSEN}$ has positive temperature dependence which is given by the resistance ratio of the fourth resistor R4 to the third resistor R3.

<<The Over-Temperature Control Circuit>>

FIG. 1 also illustrates the over-temperature control circuit 2 to which the temperature detection signal $V_{TSEN}$ and the reference signal $V_{REF}$ generated in the temperature detection circuit 10 of the semiconductor integrated circuit 1 are supplied.

The over-temperature control circuit 2 includes a differential amplifier DA100, an emitter follower transistor Q100, resistors R100-R104, capacitors C1 and C2, and a voltage comparator CP100. The differential amplifier DA100 and the voltage comparator CP100 are composed of a small-scale integrated circuits, respectively, and the emitter follower transistor Q100 is composed of a discrete NPN transistor. The resistors R100-R104 are composed of discrete resistors of a high-precision resistance, and the capacitors C1 and C2 are composed of discrete capacitors of a high-precision capacity.

The reference signal $V_{REF}$ and the temperature detection signal $V_{TSEN}$ generated by the temperature detection circuit 10 are respectively supplied to a first input terminal P1 and a second input terminal P2 in the over-temperature control circuit 2. To the first input terminal P1, a non-inverted input terminal (+) of the differential amplifier DA100, one end of the capacitor C1, and one end of the resistor R102 are coupled, and to the second input terminal P2, a non-inverted input terminal (+) of the voltage comparator CP100, one end of the capacitor C2, and one end of the resistor R103 are coupled. The other end of the capacitor C1, the other end of the resistor R102, the other end of the capacitor C2, and the other end of the resistor R103 are coupled to the ground voltage GND. The base of the emitter follower transistor Q100 is coupled to the output terminal of the differential amplifier DA100, the collector of the emitter follower transistor Q100 is coupled to the power supply voltage Vdd, and the emitter of the emitter follower transistor Q100 is coupled to the inverted input terminal (−) of the differential amplifier DA100 and one end of the resistor R100. The other end of the resistor R100 is coupled to one end of the resistor R101 and the inverted input terminal (−) of the voltage comparator CP100. The other end of the resistor R101 is coupled to the ground voltage GND. The output terminal of the voltage comparator CP100 is coupled to the power supply voltage Vdd via the resistor R104, and a shutdown control output signal $V_{SHDW}$ is generated from the output terminal of the voltage comparator CP100.

By the voltage follower which is composed of the differential amplifier DA100 and the emitter follower transistor Q100, and by the voltage dividing resistors R100 and R101, the subdivided voltage of the band gap reference voltage $V_{REF}$ with very small temperature dependence is supplied to the inverted input terminal (−) of the voltage comparator CP100. The temperature detection signal $V_{TSEN}$ which has positive temperature dependence is supplied to the non-inverted input terminal (+) of the voltage comparator CP100 via the second input terminal P2.

When the state becomes an over-temperature state where the chip temperature of the semiconductor integrated circuit 1 exceeds 135° C., for example, the temperature detection signal $V_{TSEN}$ with positive temperature dependence, supplied to the non-inverted input terminal (+) of the voltage comparator CP100, becomes higher in level than the subdivided voltage of the band gap reference voltage $V_{REF}$, supplied to the inverted input terminal (−) of the voltage comparator CP100. Therefore, responding to the chip temperature which has reached to the over-temperature state, the shutdown control output signal $V_{SHDW}$ of the output terminal of the voltage comparator CP100 changes from a low level to a high level. Responding to the change of the shutdown control output signal $V_{SHDW}$ from a low level to a high level, the power supply circuit 3 of the semiconductor integrated circuit 1 stops the supply of the internal operating power supply voltage Vcc to the central processing unit 11 through the external operating voltage supply terminal T5. In this manner, since the operation of the central processing unit 11 stops, the chip temperature of the semiconductor integrated circuit 1 falls.

The temperature detection signal $V_{TSEN}$ and the reference signal $V_{REF}$, which are generated in the temperature detection circuit 10 of the semiconductor integrated circuit 1, are respectively transferred to the non-inverted input terminal (+) and the inverted input terminal (−) of the voltage comparator CP100 of the over-temperature control circuit 2 which are mounted in the system board. Due to the noise of the system board, the power supply noise and the ground noise are generated in the semiconductor integrated circuit 1. Although noise is mixed in the temperature detection signal $V_{TSEN}$ generated in the temperature detection circuit 10, noise of an almost identical level is mixed also in the reference signal $V_{REF}$ generated in the temperature detection circuit 10. Since the temperature detection signal $V_{TSEN}$ and the reference signal $V_{REF}$ are respectively transferred to the non-inverted input terminal (+) and the inverted input terminal (−) of the voltage comparator CP100 of the over-temperature control circuit 2, the noise mixed in the temperature detection signal $V_{TSEN}$ and the noise mixed in the reference signal $V_{REF}$ can be canceled by the common mode rejection function in the differential operation of the voltage comparator CP100.

As compared with the mixing noise level to the temperature detection signal $V_{TSEN}$, when the mixing noise level to the reference signal $V_{REF}$ is low due to the voltage dividing resistors R100 and R101, the capacity value of the capacitor C2 to which the temperature detection signal $V_{TSEN}$ is supplied is rendered larger than the capacity value of the capacitor C1 to which the reference signal $V_{REF}$ is supplied; consequently, it is possible to make both mixing noise levels almost equal. By decreasing the resistance of the resistor R103 to which the temperature detection signal $V_{TSEN}$ is supplied, it is possible to make both mixing noise level almost equal.

<<A Specific System Board>>

FIG. 3 illustrates configuration of a system board for which high reliability is required as in a car navigation use, and in which a semiconductor integrated circuit 1, an over-temperature control circuit 2, and a power supply circuit 3 are mounted as a system LSI, according to a more specific embodiment of the present invention.

Also in FIG. 3, the semiconductor integrated circuit 1 is a microcomputer for car navigation use, a peripheral bus P_Bus is coupled to a CPU bus CPU_Bus via a peripheral bus controller 18, and an input/output port 16 and a peripheral module 19 are coupled to the peripheral bus P_Bus. An operation clock CLK is supplied to the central processing unit 11 from a PLL (phase locked loop) circuit 15, and the frequency of the operation clock CLK can be changed by an operating ratio controller 14.

When the state becomes an over-temperature state where the chip temperature of the semiconductor integrated circuit 1 exceeds 135° C., for example, the shutdown control output signal $V_{SHDW}$ of the output terminal of the over-temperature control circuit 2 changes from a low level to a high level, responding to the temperature detection signal $V_{TSEN}$ and the reference signal $V_{REF}$ which are generated in the temperature detection circuit 10. Responding to the change of the shutdown control output signal $V_{SHDW}$ from a low level to a high level, the power supply circuit 3 controls to stop the supply of the internal operating power supply voltage Vcc to the central processing unit 11.

<<The Multistage Control of the Operating Ratio of the Central Processing Unit>>

Before the chip temperature becomes in an over-temperature state and the internal operating power supply voltage to the central processing unit 11 is shut down by the power supply circuit 3 as described above, the operating ratio controller 14 reduces the operating ratio of the central processing unit 11 step-by-step, responding to the rise of the chip temperature. Reduction of the operating ratio of the central processing unit 11 can be realized by multistage reduction of the frequency of the operation clock CL supplied to the central processing unit 11 from the PLL circuit 15.

In order to realize the multistage control of the operating ratio of the central processing unit 11, the operating ratio controller 14 performs multilevel discrimination of the relationship between the temperature detection signal $V_{TSEN}$ and the reference signal $V_{REF}$ which are generated in the temperature detection circuit 10. As a specific example, the operating ratio controller 14 illustrated in FIG. 3 generates multilevel reference levels $V_{REF1}$, $V_{REF2}$, $V_{REF3}$, and $V_{REF4}$ from the single reference signal $V_{REF}$. The operating ratio controller 14 performs the multilevel discrimination of the relationship between each of the multilevel reference levels $V_{REF1}$, $V_{REF2}$, $V_{REF3}$, $V_{REF4}$, and the temperature detection signal $V_{TSEN}$.

Therefore, a reference voltage supply circuit 13 composed of a differential amplifier DA1 and a P-channel MOS transistor Qp1 is coupled to the operating ratio controller 14, and supplies the reference signal $V_{REF}$ generated in the temperature detection circuit 10 to the operating ratio controller 14. The reference voltage supply circuit 13 includes five voltage dividing resistors Rref1, Rref2, Rref3, Rref4, Rref5, and a switch SW, all coupled in series. The single reference signal $V_{REF}$ generated by the drain of the P-channel MOS transistor Qp1 of the reference voltage supply circuit 13 is supplied to one end of the first voltage dividing resistor Rref1. The other end of the first voltage dividing resistor Rref1 is coupled to an inverted input terminal (−) of a first voltage comparator CP1, and one end of the second voltage dividing resistor Rref2. The other end of the second voltage dividing resistor Rref2 is coupled to an inverted input terminal (−) of a second voltage comparator CP2, and one end of the third voltage dividing resistor Rref3. The other end of the third voltage dividing resistor Rref3 is coupled to an inverted input terminal (−) of a third voltage comparator CP3, and one end of the fourth voltage dividing resistor Rref4. The other end of the fourth voltage dividing resistor Rref4 is coupled to an inverted input terminal (−) of a fourth voltage comparator CP4, and one end of the fifth voltage dividing resistor Rref5, and the other end of the fifth voltage dividing resistor Rref5 is coupled to one end of the switch SW. The one end of the switch SW is coupled to the ground voltage GND in the normal operation mode of the semiconductor integrated circuit 1.

From the connection nodes of the five serially-coupled voltage dividing resistors Rref1, Rref2, Rref3, Rref4, and Rref5, four multilevel reference levels $V_{REF1}$, $V_{REF2}$, $V_{REF3}$, and $V_{REF4}$ are generated. At this time, the relationship of $V_{REF1}>V_{REF2}>V_{REF3}>V_{REF4}$ holds in the four reference levels.

On the other hand, the temperature detection signal $V_{TSEN}$ generated in the temperature detection circuit 10 is supplied in common to a non-inverted input terminal (+) of the first voltage comparator CP1, a non-inverted input terminal (+) of the second voltage comparator CP2, a non-inverted input terminal (+) of the third voltage comparator CP3, and a non-inverted input terminal (+) of the fourth voltage comparator CP4.

Since the chip temperature of the semiconductor integrated circuit 1 is low at first, the relationship of $V_{REF1}>V_{REF2}>V_{REF3}>V_{REF4}>V_{TSEN}$ holds. Therefore, the outputs from four voltage comparators (the first voltage comparator CP1, the second voltage comparator CP2, the third voltage comparator CP3, and the fourth voltage comparator CP4) are all zeroes, or "0000" in digital code. Four level shifters LS1, LS2, LS3, and LS4, which perform level conversion from a high voltage amplitude of 3.3 v to a low voltage amplitude of 1.2 v, are respectively coupled to the output terminals of four voltage comparators (the first voltage comparator CP1, the second voltage comparator CP2, the third voltage comparator CP3, and the fourth voltage comparator CP4). Therefore, from the output terminals of four level shifters LS1, LS2, LS3, and LS4, all zeroes, or "0000" in digital code, with a low voltage amplitude of 1.2 v are generated, and supplied to one of input terminals of each of four NAND circuits NAND1, NAND2, NAND3, and NAND4.

In the case of the normal operation mode and the test mode of the semiconductor integrated circuit 1, a control signal of a high level, or "1", is supplied from a mode register 20 to the other of the input terminals of each of four NAND circuits NAND1, NAND2, NAND3, and NAND4. Output signals of four NAND circuits NAND1, NAND2, NAND3, and NAND4, are supplied to an operating ratio control register 141 via four inverters Inv1, Inv2, Inv3, and Inv4.

In the state where the chip temperature of the semiconductor integrated circuit 1 is low in the normal operation mode, the contents of the operating ratio control register 141 of the operating ratio controller 14 are also all zeroes, or "0000" in digital code. Then, the frequency of the operation clock CLK supplied to the central processing unit 11 from the PLL circuit 15 is set four times higher than a reference frequency, by the control of the operating ratio controller 14. Accordingly, the operating ratio of the central processing unit 11 is set to a state of 100% of its own processing capacity.

When the chip temperature of the semiconductor integrated circuit 1 in the normal operation mode exceeds 95° C., for example, due to the operation start of the central processing unit 11, the relationship of $V_{REF1}>V_{REF2}>V_{REF3}>V_{TSEN}>V_{REF4}$ holds. Therefore, the outputs of four voltage comparators (the first voltage comparator CP1, the second voltage comparator CP2, the third voltage comparator CP3, and the fourth voltage comparator CP4) and the contents of the operating ratio control register 141 become "0001" in digital code. Then, the frequency of the operation clock CLK supplied to the central processing unit 11 from the PLL circuit 15 is set two times higher than the reference frequency, by the control of the operating ratio controller 14. Accordingly, the operating ratio of the central processing unit 11 is set to a state of 50% of its own processing capacity.

When the chip temperature of the semiconductor integrated circuit 1 in the normal operation mode exceeds 115° C., for example, according to causes such as a rise of the ambient temperature of the semiconductor integrated circuit 1, the relationship of $V_{REF1}>V_{REF2}>V_{TSEN}>V_{REF3}>V_{REF4}$ holds. Therefore, the outputs of four voltage comparators (the first voltage comparator CP1, the second voltage comparator CP2, the third voltage comparator CP3, and the fourth voltage comparator CP4) and the contents of the operating ratio control register 141 become "0011" in digital code. Then, the frequency of the operation clock CLK supplied to the central processing unit 11 from the PLL circuit 15 is set as high as the reference frequency, by the control of the operating ratio controller 14. Accordingly, the operating ratio of the central processing unit 11 is set to a state of 25% of its own processing capacity.

When the chip temperature of the semiconductor integrated circuit 1 in the normal operation mode exceeds 125° C., for example, according to causes such as a further rise of the ambient temperature of the semiconductor integrated circuit 1, the relationship of $V_{REF1}>V_{TSEN}>V_{REF2}>V_{REF3}>V_{REF4}$ holds. Therefore, the outputs of four voltage comparators (the first voltage comparator CP1, the second voltage comparator CP2, the third voltage comparator CP3, and the fourth voltage comparator CP4) and the contents of the operating ratio control register 141 become "0111" in digital code. Then, the frequency of the operation clock CLK supplied to the central processing unit 11 from the PLL circuit 15 is set to a half of the reference frequency, by the control of the operating ratio controller 14. Accordingly, the operating ratio of the central processing unit 11 is set to a state of 12.5% of its own processing capacity.

When the chip temperature of the semiconductor integrated circuit 1 in the normal operation mode exceeds 135° C., for example, according to causes such as thermal runaway of the semiconductor integrated circuit 1, the relationship of $V_{TSEN}>V_{REF1}>V_{REF2}>V_{REF3}>V_{REF4}$ holds. Therefore, the outputs of four voltage comparators (the first voltage comparator CP1, the second voltage comparator CP2, the third voltage comparator CP3, and the fourth voltage comparator CP4) and the contents of the operating ratio control register 141 become all ones, or "1111" in digital code. Then, the frequency of the operation clock CLK supplied to the central processing unit 11 from the PLL circuit 15 is set to a zero frequency (clock off state), by the control of the operating ratio controller 14. Accordingly, the operating ratio of the central processing unit 11 is set to a state of 0% of its own processing capacity. On the other hand, in a state where the chip temperature of the semiconductor integrated circuit 1 has exceeded 135° C., for example, the power supply circuit 3 of the semiconductor integrated circuit 1 has stopped the supply of the internal operating power supply voltage Vcc to the central processing unit 11, responding to the shutdown control output signal $V_{SHDW}$ from the over-temperature control circuit 2, as mentioned above. Therefore, the chip temperature of the semiconductor integrated circuit 1 is controlled, precisely and safely, by the double safety control of stopping the supply of the power supply voltage and stopping the supply of the operation clock, to the central processing unit 11. As the result, it is possible to avoid potential destruction accompanied with danger such as a firing accident, in the system board which is required for high reliability, such as a system board for car navigation use mounted with the semiconductor integrated circuit 1.

<<The Test of the Multistage Control of the Operating Ratio>>

Although the functional test of a semiconductor integrated circuit is necessary in semiconductor manufacture, it has been clarified by the examination of the present inventors that, in the test process of the semiconductor mass production, it is difficult to carry out a test to prove whether the multistage control of the operating ratio of the central processing unit 11 is properly performed, while raising the chip temperature of the semiconductor integrated circuit 1 in a practical functional test.

It has been also clarified by the examination of the present inventors that the number of the external connection terminals of the semiconductor integrated circuit 1 runs short, in monitoring by an external LSI tester whether the contents of the operating ratio control register 141 of the operating ratio controller 14 change correctly in digital code with the rise of the chip temperature of the semiconductor integrated circuit 1.

In order to solve the first problem, in the test mode, test voltage is externally supplied to the five serially-coupled voltage dividing resistors Rref1-Rref5, in order to test whether the four voltage comparators CP1, CP2, CP3, and CP4, which are provided for the multistage control of the operating ratio, operate properly even when the chip temperature of the semiconductor integrated circuit 1 is at comparatively low temperature.

In order to solve the next problem and to supply the external test voltage, the technology of the shared pin is employed, in which signal pins in the normal operation mode of the semiconductor integrated circuit 1 are shared by monitor pins and an external signal supply pin in the test mode of the semiconductor integrated circuit 1.

Before testing the semiconductor integrated circuit 1 illustrated in FIG. 3, a mode setting signal Mode_Set to set up the test mode is supplied to a mode register 20. As a result, a normal-operation-mode/test-mode switching signal Normal/Test is supplied from the mode register 20 to an input/output port 16. Therefore, a first port I/O_1, a second port I/O_2, a third port I/O_3, and a fourth port I/O_4 of an input/output port 16 are coupled to output terminals of the four inverters Inv4, Inv3, Inv2, and Inv1, respectively. Accordingly, it becomes possible to monitor the digital code of the operating ratio control register 141 by the external LSI tester. The n-th port I/O_n of the input/output port 16 is coupled to the non-inverted input terminal (+) of the differential amplifier DA2 which composes a voltage follower. At this time, the inverted input terminal (−) and the output terminal of the differential amplifier DA2 which composes a voltage follower are coupled to the other end of the voltage dividing resistor Rref5 via the switch SW.

From the exterior of the semiconductor integrated circuit 1 illustrated in FIG. 3, external test voltage is supplied to the other end of the fifth voltage dividing resistor Rref5 of the five voltage dividing resistors Rref1-Rref5, via the n-th port I/O_n of the input/output port 16 and the differential amplifier DA2 working as a voltage follower. By changing the level of the present external test voltage, the situation of level reversal of the output signals of the four voltage comparators CP1, CP2, CP3, and CP4 can be monitored from the first port I/O_1, the second port I/O_2, the third port I/O_3, and the fourth port I/O_4 of the input/output port 16, respectively, with use of the external LSI tester. In this manner, in the functional test, it becomes possible to test easily whether the multistage control of the operating ratio of the central processing unit 11 is properly performed, without raising the chip temperature of the semiconductor integrated circuit 1.

<<The Improved Over-Temperature Control Circuit>>

FIG. 4 illustrates an improved over-temperature control circuit 2 which is supplied with the temperature detection signal $V_{TSEN}$ and the reference signal $V_{REF}$, generated in the temperature detection circuit 10 of the semiconductor integrated circuit 1.

In the car-navigation system according to a more specific embodiment of the present invention illustrated in FIG. 3, when the chip temperature of the semiconductor integrated circuit 1 exceeds 135° C. for example, the supply of the power supply voltage and the supply of the operation clock are stopped; subsequently, when the chip temperature of the semiconductor integrated circuit 1 falls to less than 95° C., the supply of the internal operating power supply voltage Vcc to the central processing unit 11 by the power supply circuit 3 is resumed. Moreover, the frequency of the operation clock CLK supplied to the central processing unit 11 from the PLL circuit 15 is set to a four times higher than the reference frequency, by the control of the operating ratio controller 14, and the operation of the central processing unit 11 is started in a state of 100% of its own processing capacity.

Compared with the over-temperature control circuit 2 illustrated in FIG. 3, the over-temperature control circuit 2 illustrated in FIG. 4 includes a flip-flop FF which is reset by the power resupply and set by the over-temperature state, for example, more than 135° C. With use of the flip-flop FF which is reset by the power resupply, the supply of the internal operating power supply voltage Vcc to the central processing unit 11 by the power supply circuit 3 is resumed by the power resupply. If the power resupply is not practiced, the supply of the internal operating power supply voltage Vcc to the central processing unit 11 by the power supply circuit 3 is not resumed.

That is, a power supply detection circuit, which includes a resistor R105, a diode D105, a capacitor C3, inverters Inv6 and Inv7, is coupled to an inverted clear input terminal CRL of the flip-flop FF. After the power supply voltage Vdd is switched on and before the delay time set up by the time constant determined by the resistor R105 and the capacitor C3 elapses, the output of the inverter Inv7 is a low level "0", accordingly, the flip-flop FF is reset and the output signal Q becomes a low level "0." Therefore, the shutdown control output signal $V_{SHDW}$ generated by a NAND circuit NAND5 and an inverter Inv8 also becomes a low level "0." Responding to the shutdown control output signal $V_{SHDW}$ of a low level "0", the power supply circuit 3 starts the supply of the internal operating power supply voltage Vcc to the central processing unit 11 of the semiconductor integrated circuit 1. At this time, even if the output of the inverter Inv5 is undefined, the output of the inverter Inv8 becomes a low level "0."

After the power supply voltage Vdd is switched on and after the delay time set up by the time constant of the resistor R105 and the capacitor C3 elapses, the output signal of the inverter Inv7 changes from a low level "0" to a high level "1." Therefore, the reset action of the flip-flop FF is completed. On the other hand, when the chip temperature of the semiconductor integrated circuit 1 is not in the state of over-temperature, the output signal of the inverter Inv5 is a high level "1." Since the output signal of a high level "1" of the inverter Inv5 is supplied to the inverted trigger input terminal T of the flip-flop FF, the output signal Q of the flip-flop FF is maintained at a low level "0." Therefore, the shutdown control output signal $V_{SHDW}$ generated by the NAND circuit NAND5 and the inverter Inv8 is also maintained at a low level "0." As a result, the power supply circuit 3 maintains the supply of the internal operating power supply voltage Vcc to the central processing unit 11, and the operation of the central processing unit 11 is maintained.

Next, when the chip temperature of the semiconductor integrated circuit 1 becomes in an over-temperature state, for example, more than 135° C., the output signal of the voltage comparator CP100 of the over-temperature control circuit 2 becomes a high level, and the inverter Inv5 becomes a low level "0." Therefore, the output signal of a low level "0" of the inverter Inv5 is supplied to the inverted trigger input terminal T of the flip-flop FF, and the output signal Q of the flip-flop FF becomes a high level "1." As a result, responding to the shutdown control output signal $V_{SHDW}$ of a high level "1" generated from the NAND circuit NAND5 and the inverter Inv8, the power supply circuit 3 stops the supply of the internal operating power supply voltage Vcc to the central processing unit 11 of the semiconductor integrated circuit 1. The diode D105 of the power supply detection circuit performs a high-speed electric discharge of the terminal voltage of the capacitor C3, to the power-off state before the power resupply. Accordingly, the Flip-flop FF is certainly reset at the time of the power resupply, resulting in assured resumption of the supply of the internal operating power supply voltage Vcc by the power supply circuit 3.

<<Other Temperature Detection Circuits>>

Figure 5:
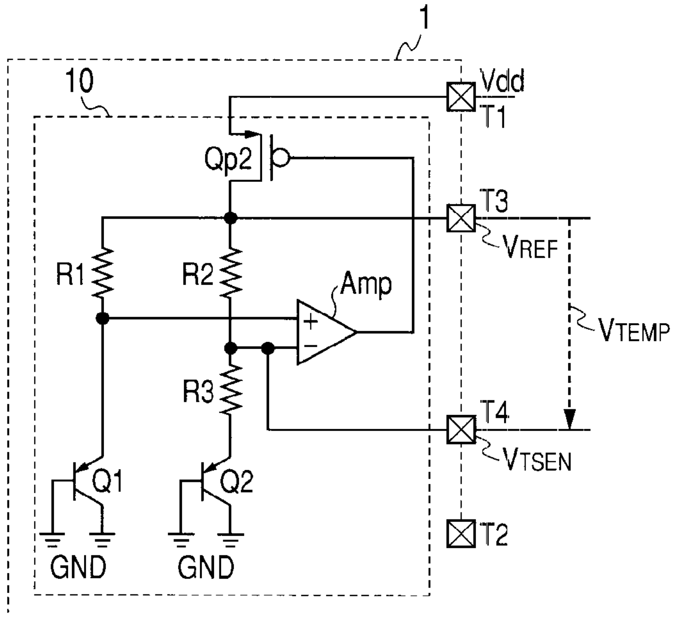
FIG. 5 is a drawing illustrating configuration of another temperature detection circuit to be used in lieu of the temperature detection circuit of the semiconductor integrated circuit illustrated in FIG. 1 or FIG. 3.

FIG. 5 illustrates configuration of another temperature detection circuit to be used in lieu of the temperature detection circuit 10 of the semiconductor integrated circuit 1 illustrated in FIG. 1 or FIG. 3.

The temperature detection circuit 10 illustrated in FIG. 5 is composed of a band gap generating part and an amplification/feedback part. The band gap generating part includes a first PNP-type transistor Q1, a second PNP-type transistor Q2, a first resistor R1, a second resistor R2, and a third resistor R3; and the amplification/feedback part includes a CMOS differential amplifier circuit Amp and a P-channel MOS transistor Qp2. In the band gap generating part, the bases and the collectors of the first transistor Q1 and the second transistor Q2 are coupled to the ground voltage GND. The emitter of the first transistor Q1 is coupled to the drain of the P-channel MOS transistor Qp2 via the first resistor R1. The emitter of the second transistor Q2 is coupled to the drain of the P-channel MOS transistor Qp2 via the third resistor R3 and the second resistor R2. The emitter of the first transistor Q1 is coupled to a non-inverted input terminal (+) of the CMOS differential amplifier circuit Amp, and the emitter of the second transistor Q2 is coupled to an inverted input terminal (−) of the CMOS differential amplifier circuit Amp via the third resistor R3. The output terminal of the CMOS differential amplifier circuit Amp is coupled to the gate of the P-channel MOS transistor Qp2. The external power voltage Vdd is supplied to the source of the P-channel MOS transistor Qp2. The band gap reference voltage $V_{REF}$ is generated from the node of the drain of the P-channel MOS transistor Qp2, the first resistor R1, and the second resistor R2; and the temperature detection signal $V_{TSEN}$ is generated from the node of the second resistor R2 and the third resistor R3.

Since the element size of the second transistor Q2 is set m times as large as the element size of the first transistor Q1, the emitter current density of the first transistor Q1 is set up m times as large as the emitter current density of the second transistor Q2. The first resistor R1 and the second resistor R2 are set to equal resistance R. By the negative feedback to the first resistor R1 and the second resistor R2 through the CMOS differential amplifier circuit Amp and the P-channel MOS transistor Qp2, emitter current Ie1 of the first transistor Q1 and emitter current Ie2 of the second transistor Q2 are mutually controlled to an equal value.

The emitter current Ie2 of the second transistor Q2 is obtained as in the following equation, by using difference voltage ΔVbe between the base-emitter voltage $Vbe_{Q1}$ of the first transistor Q1 and the base-emitter voltage $Vbe_{Q2}$ of the second transistor Q2, due to the difference of the emitter current density.

$$Ie2=\Delta Vbe/R3=kT/q\cdot 1n(m)/R3 \quad (5)$$

In the temperature detection circuit 10 illustrated in FIG. 5, a temperature signal $V_{TEMP}$ is calculated by the following equation on the basis of the band gap reference voltage $V_{REF}$ of the drain of the P-channel MOS transistor Qp2.

$$V_{TEMP}=V_{REF}-V_{TSEN}=kT/q\cdot R/R3\cdot 1n(m) \quad (6)$$

<<The Most Specific System Board>>

FIG. 6 illustrates configuration of a system board for which high reliability is required as in a car navigation use, and in which a semiconductor integrated circuit 1, an over-temperature control circuit 2, and a power supply circuit 3 are mounted as a system LSI, according to the most specific embodiment of the present invention.

The noteworthy feature in FIG. 6 is a semiconductor chip layout design in which, in the semiconductor chip of the semiconductor integrated circuit 1, the temperature detection circuit 10 is arranged in close proximity to the central processing unit 11 which is a functional block of the maximum heat generation. Therefore, only a wiring area and parasitic devices exist between the temperature detection circuit 10 and the central processing unit 11, and no other active devices nor functional blocks are interposed between them. Therefore, the temperature detection circuit 10 can detect, with a high degree of accuracy, the temperature of the central processing unit 11 which is a functional block of the maximum heat generation.

The external over-temperature control circuit 2 and the power supply circuit 3 which are mounted on the system board are coupled to the temperature detection circuit 10 of the semiconductor integrated circuit 1.

Also in FIG. 6, the semiconductor integrated circuit 1 is a microcomputer for car navigation use, a peripheral bus P_Bus is coupled to a CPU bus CPU_Bus via a peripheral bus controller 18, and an input/output port 16 and a peripheral module 19 are coupled to the peripheral bus P_Bus. An operation clock CLK is supplied to the central processing unit 11 from a PLL circuit 15, and the frequency of the operation clock CLK can be set up variably by an operating ratio controller 14.

A random access memory 21 and a high-speed access port HSAP for a flash memory module 22 are coupled to the CPU bus CPU_Bus. The central processing unit 11 can read data and a program stored in the flash memory module 22 via the high-speed access port HSAP at high speed. A low-speed access port LSAP for the flash memory module 22 is coupled to the peripheral bus P_Bus. Responding to the request from the central processing unit 11, it is possible to practice the writing operation and erasing operation of the data and the program of the flash memory module 22 via the low-speed access port LSAP.

Furthermore, a peripheral module 19, a PCI controller 23, an SDRAM controller 24, etc. are coupled to the peripheral bus P_Bus. The peripheral module 19 includes a serial port interface, an A/D converter, and a D/A converter. Here, PCI is the abbreviation for Peripheral Component Interconnect.

As the CPU bus CPU_Bus, the bus architecture called the highway bus which can transfer high-speed packet data can be employed. The central processing unit 11 may employ not only a single-core CPU but a multi-core CPU including a dual-core CPU. The central processing unit 11 may include accelerator functional modules, such as a floating point arithmetic unit (FPU), a digital signal processor (DSP), a 2D/3D image processor, and a cipher processor.

In the above, the invention accomplished by the present inventors has been specifically explained based on the embodiments. However, it cannot be overemphasized that the present invention is not restricted to the embodiments, and it can be changed variously in the range which does not deviate from the gist.

For example, the differential amplifier DA100 and the voltage comparator CP100 of the over-temperature control circuit 2 can also be formed by an internal circuit of the chip of the semiconductor integrated circuit 1 as a system LSI besides being formed by the small-scale integrated circuit, respectively. The emitter follower transistor Q100 of the over-temperature control circuit 2, the resistors R100-R104, the capacitors C1 and C2 may also be formed in the interior of the chip of the semiconductor integrated circuit 1 as a system LSI.

In this case, the first input terminal P1 and the second input terminal P2 of the over-temperature control circuit 2 which is formed in the interior of the chip of the semiconductor integrated circuit 1 as a system LSI serve as external signal terminals of the semiconductor integrated circuit 1. The reference signal $V_{REF}$ and the temperature detection signal $V_{TSEN}$, which are generated in the temperature detection circuit 10 formed in the interior of the chip of the semiconductor integrated circuit 1 as a system LSI, are led out from the external signal terminals of the semiconductor integrated circuit 1 to the exterior of the semiconductor integrated circuit 1. The reference signal $V_{REF}$ and the temperature detection signal $V_{TSEN}$ which are led out to the exterior of the semiconductor integrated circuit 1 are supplied to an external temperature control/monitoring circuit of the semiconductor integrated circuit 1, and are used for external temperature control or external temperature monitoring. Afterward, the reference signal $V_{REF}$ and the temperature detection signal $V_{TSEN}$, which are led out to the exterior of the semiconductor integrated circuit 1, are supplied to the over-temperature control circuit 2 formed in the interior of the chip, via the first input terminal P1 and the second input terminal P2 serving as the external signal terminals of the semiconductor integrated circuit 1.

Even according to the above embodiment, in the over-temperature control circuit 2 formed in the interior of the chip of the semiconductor integrated circuit 1, the noise mixed in the temperature detection signal $V_{TSEN}$ and the noise mixed in the reference signal $V_{REF}$ can be canceled by the common mode rejection function in the differential amplifier operation of the voltage comparator CP100. The reference signal $V_{REF}$ and the temperature detection signal $V_{TSEN}$, which are led out to the exterior of the semiconductor integrated circuit 1, are supplied to the external temperature control/monitoring circuit which has a circuitry type of a differential amplifier circuit with a common mode rejection function. Accordingly, the external temperature control or external temperature monitoring with little influence of noise of a system become realizable. As an example of the external temperature control circuit, control of the rotational frequency of a cooling fan is also possible, for example. As an example of the external temperature monitoring, it is also possible to convert the external temperature monitoring analog signal into an external temperature monitoring digital signal by an A/D converter, and to supply this external temperature monitoring digital signal to a display device of a display panel in front of the driver's seat of a vehicle.

As a variable setup of the operating ratio of the central processing unit 11 by the operating ratio controller 14, it is possible not only to variably set the frequency of the operation clock CLK but also to variably set the internal operating power supply voltage Vcc to be supplied to the central processing unit 11 from the power supply circuit 3. It is also possible for the operating ratio controller 14 to variably set the operating speed of the CMOS logic circuit, by controlling a substrate bias control circuit, and by setting variably the substrate bias voltage of an N-type well and a P-type well of a P-channel MOS transistor and an N-channel MOS transistor of the CMOS logic circuit of the central processing unit 11.

The power supply circuit 3 may also be formed in the interior of the chip of the semiconductor integrated circuit 1 as a system LSI. That is, a circuit which controls directly the supply of the power supply voltage may also be integrated inside the chip. In this case, it is also possible to control, from the interior of the chip, the supply of the internal operating power source to the central processing unit 11, responding to the input of the shutdown control output signal $V_{SHDW}$. It is possible for the power supply circuit inside the chip to supply and to shut down the internal operating power supply voltage Vcc to the central processing unit, responding to the shutdown control output signal $V_{SHDW}$. It is also possible to control the supply and the shutdown of the internal operating power supply voltage Vcc to be supplied to at least one of the random access memory, the flash memory module, the peripheral module, the PCI controller, and the SDRAM controller, which are mounted in the interior of the chip of the semiconductor integrated circuit 1.

The present invention can be used not only in a car-navigation system, but can be used in a broad applicable field and in applications as various electronic systems which are robust against the EMI noise in a system board.

What is claimed is:

1. A semiconductor integrated circuit comprising:

a temperature detection circuit operable to detect chip temperature; and a functional module flowing operating current greater than operating current of the temperature detection circuit, wherein the functional module is coupled to an external operating voltage supply terminal to which operating voltage is supplied from the exterior of the semiconductor integrated circuit, and to an external ground voltage supply terminal to which ground voltage is supplied from the exterior of the semiconductor integrated circuit, wherein the temperature detection circuit generates a temperature detection signal having prescribed temperature dependence and a reference signal having temperature dependence smaller than the prescribed temperature dependence, wherein the reference signal and the temperature detection signal are led to the exterior of the semiconductor integrated circuit via a first external output terminal and a second external output terminal, respectively, so as to enable one of controlling by an external temperature control circuit and monitoring by an external temperature monitoring circuit in the exterior of the semiconductor integrated circuit, the external temperature control circuit and the external temperature monitoring circuit having a circuitry type of differential amplifier circuit, and wherein the reference signal and the temperature detection signal, which are led to the exterior of the semiconductor integrated circuit, are supplied to one of the external temperature control circuit and the external temperature monitoring circuit.

2. The semiconductor integrated circuit according to claim 1, wherein, in a chip of the semiconductor integrated circuit, the temperature detection circuit is arranged in close proximity to the functional module, without another functional device and another functional block interposed between the temperature detection circuit and the functional module.

3. The semiconductor integrated circuit according to claim 2, wherein the reference signal and the temperature detection signal generated by the temperature detection circuit are supplied to an operating ratio control circuit having a circuitry type of a plurality of differential amplifier circuits, wherein the plural differential amplifier circuits of the operating ratio control circuit perform multilevel discrimination of relationship between the reference signal and the temperature detection signal generated by the temperature detection circuit, and generate a multilevel discrimination result, and wherein, when the chip temperature rises, the operating ratio control circuit uses the multilevel discrimination result to decrease operation ratio of the functional module step-by-step.

4. The semiconductor integrated circuit according to claim 3, wherein the reference signal and the temperature detection signal generated by the temperature detection circuit are also supplied to an over-temperature control circuit having a circuitry type of a first differential amplifier circuit, and wherein, in an over-temperature state where the chip temperature exceeds a prescribed temperature, the first differential amplifier circuit of the over-temperature control circuit shuts off supply of power supply voltage to be supplied to the functional module, in response to the reference signal and the temperature detection signal generated by the temperature detection circuit.

5. The semiconductor integrated circuit according to claim 4, wherein, when the semiconductor integrated circuit is in a test mode, an external test signal is supplied from the exterior of the semiconductor integrated circuit to the plural differential amplifier circuits of the operating ratio control circuit, and wherein, in the test mode, supplying the external test signal from the exterior of the semiconductor integrated circuit enables testing for the plural differential amplifier circuits, which generate the multilevel discrimination result, in a state where the chip temperature of the semiconductor integrated circuit is low.

6. The semiconductor integrated circuit according to claim 5, wherein a plurality of test monitor terminals through which the test results of the plural differential amplifier circuits are retrieved to external test equipment in the test mode, and an external signal supply terminal through which the external test signal is supplied are shared by a plurality of signal terminals of the semiconductor integrated circuit in a normal operation mode.

7. The semiconductor integrated circuit according to claim 6, wherein the functional module includes a central processing unit.

8. The semiconductor integrated circuit according to claim 7, wherein the operating ratio control circuit controls the operating ratio of the central processing unit by changing a frequency of an operation clock which is supplied to the central processing unit of the functional module.

9. A semiconductor integrated circuit comprising:

a temperature detection circuit operable to detect chip temperature; and a functional module flowing operating current greater than operating current of the temperature detection circuit, wherein the functional module is coupled to an external operating voltage supply terminal to which operating voltage is supplied from the exterior of the semiconductor integrated circuit, and to an external ground voltage supply terminal to which ground voltage is supplied from the exterior of the semiconductor integrated circuit, wherein the temperature detection circuit generates a temperature detection signal having prescribed temperature dependence and a reference signal having temperature dependence smaller than the prescribed temperature dependence, wherein the reference signal and the temperature detection signal generated by the temperature detection circuit are supplied to an over-temperature control circuit having a circuitry type of a first differential amplifier circuit and also to an operating ratio control circuit having a circuitry type of a plurality of differential amplifier circuits, wherein the plural differential amplifier circuits of the operating ratio control circuit perform multilevel discrimination of relationship between the reference signal and the temperature detection signal generated by the temperature detection circuit, and generate a multilevel discrimination result, wherein, when the chip temperature rises, the operating ratio control circuit uses the multilevel discrimination result to decrease operation ratio of the functional module step-by-step, and wherein, in an over-temperature state where the chip temperature exceeds a prescribed temperature, the first differential amplifier circuit of the over-temperature control circuit shuts off supply of power supply voltage to be supplied to the functional module, in response to the reference signal and the temperature detection signal generated by the temperature detection circuit.

10. The semiconductor integrated circuit according to claim 9, wherein, in a chip of the semiconductor integrated circuit, the temperature detection circuit is arranged in close proximity to the functional module, without another functional device and another functional block interposed between the temperature detection circuit and the functional module.

11. The semiconductor integrated circuit according to claim 10, wherein, when the semiconductor integrated circuit is in a test mode, an external test signal is supplied from the exterior of the semiconductor integrated circuit to the plural differential amplifier circuits of the operating ratio control circuit, and wherein, in the test mode, supplying the external test signal from the exterior of the semiconductor integrated circuit enables testing for the plural differential amplifier circuits, which generate the multilevel discrimination result, in a state where the chip temperature of the semiconductor integrated circuit is low.

12. The semiconductor integrated circuit according to claim 11, wherein a plurality of test monitor terminals through which the test results of the plural differential amplifier circuits are retrieved to external test equipment in the test mode, and an external signal supply terminal through which the external test signal is supplied are shared by a plurality of signal terminals of the semiconductor integrated circuit in a normal operation mode.

13. The semiconductor integrated circuit according to claim 12, wherein the functional module includes a central processing unit.

14. The semiconductor integrated circuit according to claim 13, wherein the operating ratio control circuit controls the operating ratio of the central processing unit by changing a frequency of an operation clock which is supplied to the central processing unit of the functional module.

15. An operation method for a semiconductor integrated circuit, the semiconductor integrated circuit comprising:

a temperature detection circuit operable to detect chip temperature; and a functional module flowing operating current greater than operating current of the temperature detection circuit, wherein the functional module is coupled to an external operating voltage supply terminal to which operating voltage is supplied from the exterior of the semiconductor integrated circuit, and to an external ground voltage supply terminal to which ground voltage is supplied from the exterior of the semiconductor integrated circuit, wherein the temperature detection circuit generates a temperature detection signal having prescribed temperature dependence and a reference signal having temperature dependence smaller than the prescribed temperature dependence, wherein the reference signal and the temperature detection signal generated by the temperature detection circuit are supplied to an over-temperature control circuit having a circuitry type of a first differential amplifier circuit and also to an operating ratio control circuit having a circuitry type of a plurality of differential amplifier circuits, wherein the plural differential amplifier circuits of the operating ratio control circuit perform multilevel discrimination of relationship between the reference signal and the temperature detection signal generated by the temperature detection circuit, and generate a multilevel discrimination result, wherein the semiconductor integrated circuit is mounted on a mother board of a system, and when the chip temperature during operation of the semiconductor integrated circuit on the mother board of the system rises, the operating ratio control circuit uses the multilevel discrimination result to decrease operation ratio of the functional module step-by-step, and wherein, in an over-temperature state where the chip temperature during the operation of the semiconductor integrated circuit exceeds a prescribed temperature, the first differential amplifier circuit of the over-temperature control circuit shuts off supply of power supply voltage to be supplied to the functional module, in response to the reference signal and the temperature detection signal generated by the temperature detection circuit.

16. The operation method for the semiconductor integrated circuit according to claim 15, wherein, in a chip of the semiconductor integrated circuit, the temperature detection circuit is arranged in close proximity to the functional module, without another functional device and another functional block interposed between the temperature detection circuit and the functional module.

17. The operation method for the semiconductor integrated circuit according to claim 16, wherein the functional module includes a central processing unit.

18. The operation method for the semiconductor integrated circuit according to claim 17, wherein the operating ratio control circuit controls the operating ratio of the central processing unit by changing a frequency of an operation clock which is supplied to the central processing unit of the functional module.

* * * * *